United States Patent [19]

Knappenberger

[11] 4,086,426

[45] Apr. 25, 1978

[54] STRESS RELIEVED PRINTED WIRING BOARD

[75] Inventor: Thomas A. Knappenberger, Scottsdale, Ariz.

[73] Assignee: Motorola Inc., Schaumburg, Ill.

[21] Appl. No.: 701,833

[22] Filed: Jul. 1, 1976

[51] Int. Cl.[2] .............................................. H05K 1/08

[52] U.S. Cl. .................................... 174/68.5; 29/626; 361/398

[58] Field of Search .................. 174/68.5; 228/180 R; 361/397, 398, 400, 404, 408; 29/625, 626, 628; 339/275 B; 338/316

[56] References Cited

U.S. PATENT DOCUMENTS

| | | | |
|---|---|---|---|
| 3,239,895 | 3/1966 | Stuckert | 29/626 |
| 3,290,558 | 12/1966 | Sapy | 174/68.5 |
| 3,321,570 | 5/1967 | Webb | 174/68.5 |
| 3,345,622 | 10/1967 | Matsushita | 174/68.5 |

*Primary Examiner*—Bruce A. Reynolds
*Attorney, Agent, or Firm*—Eugene A. Parsons

[57] ABSTRACT

A board of dielectric material having printed electrical circuitry on at least one side thereof with at least one mounting pad and a hole through the board in the center of the mounting pad for receiving the connecting lead of a component with a stress relief hole, having a diameter larger than the diameter of the mounting pad, extending from the surface opposite the electrical circuitry, coaxial with the mounting hole and to within a short distance of the surface carrying the mounting pad to permit minute motions of the circuit and component connected thereto and provide the necessary stress relief for thermal expansion differentials of connecting lead and board materials.

4 Claims, 1 Drawing Figure

15
14
12
20
21
11
10
16

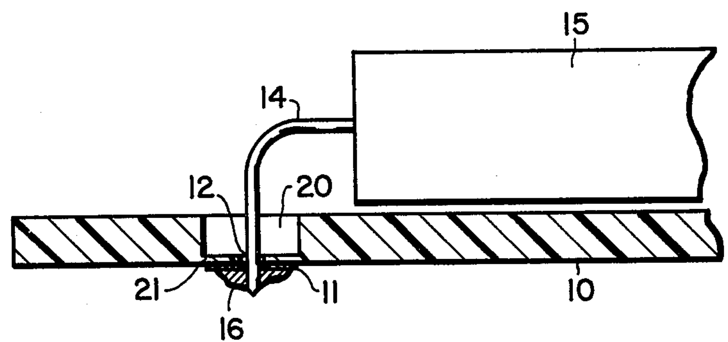
15
14
12
20
21
11
10
16

STRESS RELIEVED PRINTED WIRING BOARD

BACKGROUND OF THE INVENTION

The present invention pertains to printed wiring boards having printed electrical circuitry on at least one side thereof and components mounted on the opposite side with the leads thereof extending through the board and mechanically and electrically connected thereto by solder or the like at a mounting pad. In printed wiring assemblies of this type cracked solder joints are relatively common because of combined thermal stresses and dynamic environments (shock and other vibrations). Since the board and the connecting lead have significantly different co-efficients of thermal expansion, a stress is set up when the motion of the lead relative to the board is constrained. The amount of stress is proportional to the relative thermal co-efficients of the materials as well as the board thickness and the free lead length of the component. It is well known and has been shown both analytically and experimentally that as the board thickness is reduced the incidence of solder joint cracking is reduced dramatically. For example, in a typical system with a single sided board and constrained component on a .062 inch thick board, solder joint cracking is common and easy to reproduce. With a 0.032 thick board, solder joint cracking is harder to reproduce but visible stress can be induced readily. With a 0.015 inch board, it is difficult, if not impossible to reproduce solder joint cracking and visible stress is relatively minor. Thus, one solution to the relief of thermal cycling solder joint fracture is to use a very thin board (0.015inch or preferably less). However, as the thickness of the printed wiring board is reduced, its ability to withstand dynamic environments, such as sinusoidal or random vibration or shock, is also reduced. Dynamic response of the board goes up and, natural frequency goes down, as the board thickness is reduced. Because of larger excursions of the board at lower frequency resonances, fatigue becomes a problem with solder joints and component leads. Hence, the thin boards must have some means of support other than the board structure. Also, as the area of the board is increased additional supporting structure is required. Hence the use of thinner boards for thermal cycling and the use of thicker boards to meet high dynamic environments appear to be mutually exclusive.

The method most used to combat this problem in the prior art is rigidity of the printed wiring board and flexibility in the component lead. It is not practical to reduce the size of the component leads enough to give the required flexibility so, in most cases, stress relief is gained by increasing the length of the lead and forming some sort of bend such that the forces required to flex the lead are significantly less than those required to break the solder joint. The major drawback of this approach is that it is wasteful of component mounting space. Component mounting density is reduced between 25 and 50% when this method is used over a normal high density board. This waste of space is intolerable in most applications and especially in weight and space sensitive aerospace applications where space or weight is at a premium.

SUMMARY OF THE INVENTION

The present invention pertains to a stress relived printed wiring board of dielectric material with printed electrical circuitry on at least one side thereof with at least one mounting pad formed therein for connecting a lead of a component thereto, said board having a lead connecting hole extending therethrough at approximately the center of the mounting pad and a stress relief hole extending partially into the board from the side opposite the stress relief pad with a diameter larger than the stress relief pad.

It is an object of the present invention to provide a new and improved stress relieved printed wiring board which allows the flexibility of the circuit within the range of thermal cycling stresses and provides the rigidity of the assembly such that components can be secured to the printed wiring board and the board can provide the structure to support itself.

This and other objects of this invention will become apparent to those skilled in the art upon consideration of the accompanying specification, claims and drawing.

BRIEF DESCRIPTION OF THE DRAWING

The single FIGURE. is a sectional view of a portion of a printed wiring board, with a component attached thereto, embodying the present invention.

DESCRIPTION OF THE PREFERRED EMBODIMENT

Referring specifically to the figure, the numeral 10 designates a board of dielectric material having a printed electrical circuit on the lower surface thereof. The printed electrical circuit includes a mounting pad 11 and, only the mounting pad 11 is illustrated in the FIGURE to simplify the description and the view. The mounting pad 11 is illustrated as a generally circular pad, although it should be understood that substantially any desired configuration might be utilized. A first hole 12 is formed in the board 10 approximately in the center of the pad 11. The hole 12 has a diameter larger than a lead 14 of a component 15. The lead 14 of the component 15 is adapted to be inserted through the hole 12 and mechanically and electrically connected to the pad 11 by means of solder or the like at 16. Therefore, the diameter of the hole 12 should be just large enough to receive the lead 14 therethrough and to allow sufficient clearance for forming an adequate solder fillet (≈0.003).

Prior to inserting the lead 14 into the hole 12, a second, or stress relief, hole 20 is formed in the board 10 coaxial with the hole 12 and extending into the board 10 from the side opposite the mounting pad 11. The diameter or area of the hole 20 should be greater than the diameter or area of the mounting pad 11 and the thickness of the remaining wall at the bottom of the hole 20 should be such that the flexibility of the circuit is within the range of thermal cycling stresses (approximately one to several ten thousandths of an inch depending upon the thickness of the board). This provides a thin flexible section in the region of the solder joint 16 while the rest of the board 10 retains the structural integrity of an equivalent thickness board. By making the wall 21 at the bottom of the hole 20 the same thickness for any thickness of board, up to the limit of the flexibility of the mounting pad 11, the thickness of the board 10 can be a function of the structural requirements, rather than a compromise for flexibility. It has been found, for example, that the thickness of the wall 21 at the bottom of the hole 20 should be approximately 0.004 inches for best results and the diameter of the hole 20 should be at least 0.010 inches larger than the diameter of the mounting pad 11. If the stress relief portion is maintained approximately at this size the board 10 can be substantially any desired thickness from 0.015 inches to 0.125 inches or above.

Several methods may be devised for constructing the stress relieved printed wiring board and one such method is to provide a glass epoxy board approximately 0.004 inches thick with printed electrical circuitry on one side thereof. The proper connecting holes are then drilled through the mounting pads. A second board, which may be 0.015 inches, 0.032 inches, 0.063 inches 0.125 inches, etc. is then constructed so as to be coextensive with the first board and holes are drilled therethrough so as to be coaxial with the connecting holes in the first board and to have a diameter approximately 0.010 inches larger than the mounting pads on the first board. The two boards are then placed so that the holes are in proper register with the circuit side out on the thin board and the two boards are laminated together using well established multilayer techniques.

A second method of constructing the stress relieved printed wiring board described above is to provide a dieletric board with the desired thickness with the printed circuits thereon, and drill the connecting holes in the circuit pads through the board using the smallest size drill needed for allowing the component leads to be inserted therethrough (usually 0.025 inches). From the side opposite the printed circuitry, counter bore holes approximately 0.010 inches larger than the largest mounting pad to within approximately 0.004 inches of the circuit side of the board using the connecting holes as a pilot for the counter bore. It should be understood that many other methods of providing the stress relieved printed wiring board may be deviced by those skilled in the art and the above two methods are explained because of their simplicity and ease of use.

Thus, a new and improved stress relieved printed wiring board is described which allows the flexibility of the circuit mounted thereon within the range of thermal cycling stresses and provides the rigidity of the assembly such that components can be secured to the printed wiring board and the board can provide the structure to support itself. The stress relieved board meets thermal cycling, vibration, shock or acceleration environments without sacrificing board area, eliminates cracked solder joints, permits high density packaging and is a relatively low cost method easy to implement. While I have shown and described a specific embodiment of this invention, further modifications and improvements will occur to those skilled in the art. I desire it to be understood, therefore, that this invention is not limited to the particular form shown and I intend in the appended claims to cover all modifications which do not depart from the spirit and scope of this invention.

I claim:

1. A stress relieved printed wiring board comprising:
(a) a board of dielectric material with two major surfaces;
(b) printed electrical circuitry affixed to one major surface of said board with at least one mounting pad formed therein for connecting a lead of a component thereto;
(c) said board having defined therethrough a hole approximately centered in said mounting pad and having a diameter slightly greater than the diameter of a connecting lead to be received therein; and
(d) said board further having defined therein a second hole substantially coaxial with said first hole with a cross-sectional area larger than the area of said mounting pad bearing against the one major surface, the second hole extending partially through said board from the major surface opposite said mounting pad toward the major surface having said mounting pad thereon to reduce the thickness of said board contiguous with said mounting pad for relieving stress caused by thermal cycling and dynamic environments.

2. A stress relieved printed wiring board as claimed in claim 1 wherein the mounting pad is generally circular and the diameter of the second hole defined in the board is greater than the diameter of the mounting pad.

3. A stress relieved printed wiring board as claimed in claim 1 wherein the second hole defined in the board extends through the board to within approximately four thousandths of an inch of the major surface having the mounting pad thereon.

4. A stress relieved printed wiring board as claimed in claim 2 wherein the diameter of the second hole is at least approximately ten thousandths of an inch greater than the diameter of the mounting pad.

* * * * *